(12) United States Patent  
Maeda

(10) Patent No.: US 7,405,500 B2
(45) Date of Patent: Jul. 29, 2008

(54) BONDING APPARATUS

(75) Inventor: Toru Maeda, Tokyo (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 441 days.

(21) Appl. No.: 11/237,450

(22) Filed: Sep. 28, 2005

(65) Prior Publication Data

US 2006/0065372 A1    Mar. 30, 2006

(30) Foreign Application Priority Data

Sep. 28, 2004    (JP)    ............................. 2004-282461

(51) Int. Cl.
| F16F 15/04 | (2006.01) |
| H02K 7/00 | (2006.01) |
| H01L 21/50 | (2006.01) |
| B41J 23/00 | (2006.01) |

(52) U.S. Cl. ........................... 310/17; 310/51; 248/638; 33/1 M; 228/4.5

(58) Field of Classification Search .................. 310/12, 310/15, 17, 51; 156/538; 228/4.5, 180.5; 248/637–638, 615, 550; 438/617

See application file for complete search history.

(56) References Cited

U.S. PATENT DOCUMENTS

| 4,728,831 | A | * | 3/1988 | Cheng | ........................ 310/13 |
| 4,798,006 | A | * | 1/1989 | Barnaby | ...................... 33/573 |
| 4,978,050 | A | * | 12/1990 | Amador | ...................... 228/4.5 |
| 5,042,783 | A | * | 8/1991 | Ciolczyk et al. | .............. 267/81 |
| 5,208,497 | A | * | 5/1993 | Ishii et al. | ..................... 310/12 |
| 5,358,210 | A | * | 10/1994 | Simon et al. | ................ 248/628 |
| 5,573,220 | A | * | 11/1996 | Whittaker et al. | ........... 248/638 |
| 5,712,038 | A | * | 1/1998 | Yamazaki et al. | ........ 428/411.1 |
| 5,858,521 | A | * | 1/1999 | Okuda et al. | ................ 428/219 |
| 5,902,656 | A | * | 5/1999 | Hwang | ..................... 428/36.91 |
| 5,982,128 | A | * | 11/1999 | Lee | ........................ 318/568.16 |
| 6,170,622 | B1 | * | 1/2001 | Wakui et al. | ................ 188/378 |
| 6,316,901 | B2 | * | 11/2001 | Lee | ............................. 318/649 |
| 6,518,721 | B2 | * | 2/2003 | Mayama | ..................... 318/632 |
| 6,524,692 | B1 | * | 2/2003 | Rosen | ..................... 428/298.4 |
| 6,861,771 | B2 | * | 3/2005 | Zhai et al. | ..................... 310/12 |
| 7,222,434 | B2 | * | 5/2007 | Kikuchi | ........................ 33/503 |
| 7,303,184 | B1 | * | 12/2007 | Bower et al. | ................ 267/136 |

FOREIGN PATENT DOCUMENTS

JP    2981999    11/1999

* cited by examiner

*Primary Examiner*—Burton Mullins
(74) *Attorney, Agent, or Firm*—William L. Androlia; H. Henry Koda

(57) ABSTRACT

A wire bonding apparatus 10 including an X table 18 guided to move in the X direction on an XY table base 14 and a driving motor 20 mounted on a motor base 16 with the movable element 22 of the driving motor 20 connected to the X table 18. The motor main body 24 is guided by a pair of motor guides 26 so as to be movable in the X direction via the laminated bodies 40. In each laminated body 40, viscoelastic flat rubber plates that have a spring element and a damping element, and flat rigid plates, are alternately disposed and laminated, so that the rigidity is large in the direction perpendicular to the laminated surfaces, and the rigidity is small in the direction parallel to the laminated surfaces, and the laminated bodies have a recovery force and a damping force due to the viscoelasticity.

6 Claims, 4 Drawing Sheets

BONDING APPARATUS

BACKGROUND OF THE INVENTION

1. Field of the Invention

The present invention relates to a bonding apparatus in which a bonding motor having a movable element and a motor main body is disposed on a mounting base, and the motor main body is provided to be movable in the opposite direction from the movable element when the movable element is driven, so that the reaction force applied to the mounting base as a result of the driving of the movable element is canceled out.

2. Description of the Related Art

In bonding apparatuses such as die bonding apparatuses which position chips and die-bond them to a board, wire bonding apparatuses which connect leads on a board and pads on chips by wires and the like, bonding work is performed while performing positioning of the board and chips or positioning of the leads and pads. A motor driving device is used for this positioning. For example, an XY table or the like on which the board or the like is mounted is driven to arbitrary positions.

When the load of an XY table or the like is thus driven using a motor driving device, vibration is, as a result of the reaction force caused by the driving of the load, applied to the mounting base of the bonding apparatus to which the motor driving device is attached. Especially in recent years, as precise, high-speed positioning has become a requirement in bonding apparatuses, the question of how to reduce vibration generated by an XY table or the like moving at a high speed has become a problem.

Elimination of the reaction movement of a motor driving device, which is used in a semiconductor manufacturing apparatus such as a bonding apparatus or the like and drives a driving body by means of a motor, is disclosed in Japanese Patent No. 2981999.

In this prior art, the motor main body and driving body are disposed on a mounting base so as to be movable in the direction of the common driving axes, so that the motor main body can move in the opposite direction from the driving body when the driving body is driven, thus causing the reaction force caused by the driving of the driving body to be cancelled. Furthermore, in this prior art, a pair of parallel guide rails are disposed between the mounting base and the motor main body in order to guide the movement of the motor main body. The motor main body that has moved in the opposite direction from the driving body is subsequently returned to its original position.

In such a motor device in which the reaction movement is eliminated, a mechanism that supports the weight of the motor main body itself and is also used to regulate the direction of movement of the motor main body (such as the pair of parallel guide rails indicated in the above-described prior art), is required. Accordingly, precision is required in the geometrical tolerance (flatness, degree of parallel orientation and the like) of the surface of the mounting base to which the two guide rails are attached. In some cases, furthermore, the movement of the motor main body may be hampered as a result of strain generated during the attachment of these guide rails, strain generated during the installation of the apparatus, thermal strain during the operation of the apparatus and the like.

As seen from the above, in the above-described prior art prior art, Japanese Patent No. 2981999, precision is required in the guide mechanism that guides the movement of the motor main body in order to eliminate any reaction movement in the bonding apparatus, and assembly, adjustment and the like are also bothersome, increasing the manufacturing cost.

BRIEF SUMMARY OF THE INVENTION

Accordingly, it is an object of the present invention to provide a bonding apparatus that makes it possible to eliminate the reaction movement by means of a simple construction.

The above object is accomplished by a unique structure of the present invention for a bonding apparatus in which a bonding motor having a movable element and a motor main body is provided on a mounting base, the motor main body being movable in the opposite direction from the movable element when the movable element is driven, so that the reaction force applied to the mounting base as a result of the driving of the movable element is canceled; and in the present invention, the bonding apparatus comprises:

motor guides which guide the movement of the motor main body, and a plurality of laminated bodies which are disposed between the motor main body and the motor guides; wherein each of the plurality of laminated bodies comprises flat rigid plates and viscoelastic flat rubber plates having spring elements and damping elements, so that the flat rigid plates and viscoelastic flat rubber plates are alternately disposed and stacked in a plurality of stages with the mutually facing surfaces of these plates fastened to each other; and with reference to an external force applied between the outermost surface and the other surface of the laminated body, the rigidity in the direction perpendicular to the laminated surfaces of the flat rigid plates and viscoelastic flat rubber plates is set to be greater than the rigidity in the direction parallel to the laminated surfaces of the flat rigid plates and viscoelastic flat rubber plates, thus having a recovery force and a damping force based on viscoelasticity; and the laminated surfaces are disposed parallel to the direction of movement of the motor main body, and one surface of each one of the laminated bodies is attached to the motor main body while the other surface thereof is attached to the motor guides.

In the above structure, it is preferable that the motor main body have, on both side surfaces thereof, motor side attachment portions which include wall surfaces that are parallel to the direction of movement of the motor main body, the motor guides have guide side attachment portions which face side surfaces of the motor main body and include wall surfaces that are parallel to the direction of movement of the motor main body and that face the motor side attachment portions, and one surface of each one of the laminated bodies be attached to one of the motor side attachment portions while the other surface thereof is attached to one of the guide side attachment portions.

It is also preferable that the bonding apparatus further comprising a driving means that presses the laminated bodies against the motor main body and increase further the rigidity in the direction perpendicular to the laminated surfaces.

It is also preferable that the viscoelastic rubber plates be constructed from a gel material that is either silicone type rubber or styrene type rubber.

It is further preferable that the plurality of laminated bodies be disposed in positions in the horizontal plane including the center of gravity of the motor main body on both side surfaces of the motor main body and in positions that are symmetrical with respect to an axis that coincides with the direction of movement of the motor main body including the center of gravity thereof.

In addition, in the present invention, the bonding apparatus may further include a plurality of rollers that are disposed on the mounting base and support the motor main body to allow the motor main body to make movement.

In the above-described structure of the present invention, laminated bodies in which viscoelastic rubber plates and rigid plates are superimposed one on the other are disposed between the motor main body and the motor guides. When a force is applied parallel to the upper and lower surfaces of flat viscoelastic rubber plates which are set horizontally, a considerable viscoelastic shear strain is generated in the direction of the upper and lower surfaces. In this case, when a force is applied perpendicular to the upper and lower surfaces of the viscoelastic rubber plates, tensile and compressive strains are generated in the direction perpendicular to the upper and lower surfaces; however, by way of setting the thickness of the viscoelastic rubber plates to be at an appropriately thin value, then the amount of deformation of the viscoelastic rubber plates is small enough so that this deformation can be ignored. More specifically, when a force is applied to these upper and lower surfaces of appropriately thin flat viscoelastic rubber plates, such viscoelastic rubber plates have a large rigidity in the direction perpendicular to the upper and lower surfaces and a small rigidity in the direction parallel to the upper and lower surfaces, so that these plates have a recovery force and damping force arising from viscoelasticity. Even if the viscoelastic shear strain of a single viscoelastic rubber plate is small, an appropriate amount of deformation can be obtained by laminating viscoelastic rubber plates and rigid plates in a plurality of stages to form a laminated body.

Accordingly, with a simple construction in which a plurality of the above-described laminated bodies are disposed between the motor guides and motor main body with the laminated surfaces of the laminated bodies oriented parallel to the direction of movement of the motor main body, the movement of the motor main body can be regulated in the direction perpendicular to the direction of movement of the motor main body, so that the motor main body can be freely moved within the permissible strain range in the direction of movement of the motor main body. Furthermore, because of the viscoelasticity of the laminated bodies, a damping effect acts on the movement of the motor main body, thus suppressing unnecessary vibration. Moreover, as a result of the viscoelastic recovery force, the motor main body can be restored to its original position prior to movement.

In the present invention, the laminated bodies are provided between motor side attachment portions of both side surfaces of the motor main body and guide side attachment portions that correspond to these motor side attachment portions. Accordingly, the movement of the motor main body in the opposite direction from the driving body can be guided by a simple construction.

Furthermore, the bonding apparatus of the present invention includes a driving means that presses the laminated bodies against the motor main body. Accordingly, even in cases where the plate thickness of the viscoelastic rubber plates is large, and the tensile-compressive strain generated in the direction perpendicular to the upper and lower surfaces of the viscoelastic rubber plates is large, the tensile-compressive strain can be reduced to a value that can be ignored because of the pressure applied by the above-described pressing of the driving means. Accordingly, with the use of a simple construction in accordance with the thickness of the viscoelastic rubber plates, the rigidity of the laminated bodies is sufficiently large in the direction perpendicular to the upper and lower surfaces, and this rigidity is sufficiently small in the direction parallel to the upper and lower surfaces, and the laminated bodies have a recovery force and damping force based on viscoelasticity.

In the present invention, since a gel material of a silicone type rubber or styrene type rubber is used for the viscoelastic rubber plates, desired viscoelastic characteristics is obtained by means of a simple construction in which these plates are laminated in an appropriate number of stages, without using a complicated viscoelasticity generating mechanism.

Furthermore, the laminated bodies of the present invention are disposed on both side surfaces of the motor main body in positions within the horizontal plane including the center of gravity of the motor main body, and in positions that are symmetrical with respect to an axis that coincides with the direction of movement of the motor main body including the center of gravity. Accordingly, the generation of unnecessary torque by the recovery force or damping force generated by the laminated bodies can be suppressed.

In addition, by way of installing roller bodies on the mounting base so that it supports the motor main body, the motor main body can move smoothly while the weight of the motor main body itself is supported.

As seen from the above, according to the present invention, an elimination of reaction movement in a bonding apparatus can be realized by a simple construction.

DETAILED DESCRIPTION OF THE INVENTION

One embodiment of the present invention will be described in detail below with reference to the accompanying drawings. The present invention will be described with reference to a wire bonding apparatus; however, the present invention is applicable to some other type of bonding apparatus, e.g., a die bonding apparatus that performs die bonding, a face-down bonding apparatus, a wire bonding apparatus in stacked ICs in which chips are stacked on other chips, or the like. Furthermore, an XY table will be described as a component that is driven by the movable element; however, the component that is driven by the movable element can be some other moving body used in a bonding apparatus, e.g., a bonding tool or the like.

Figure 1:
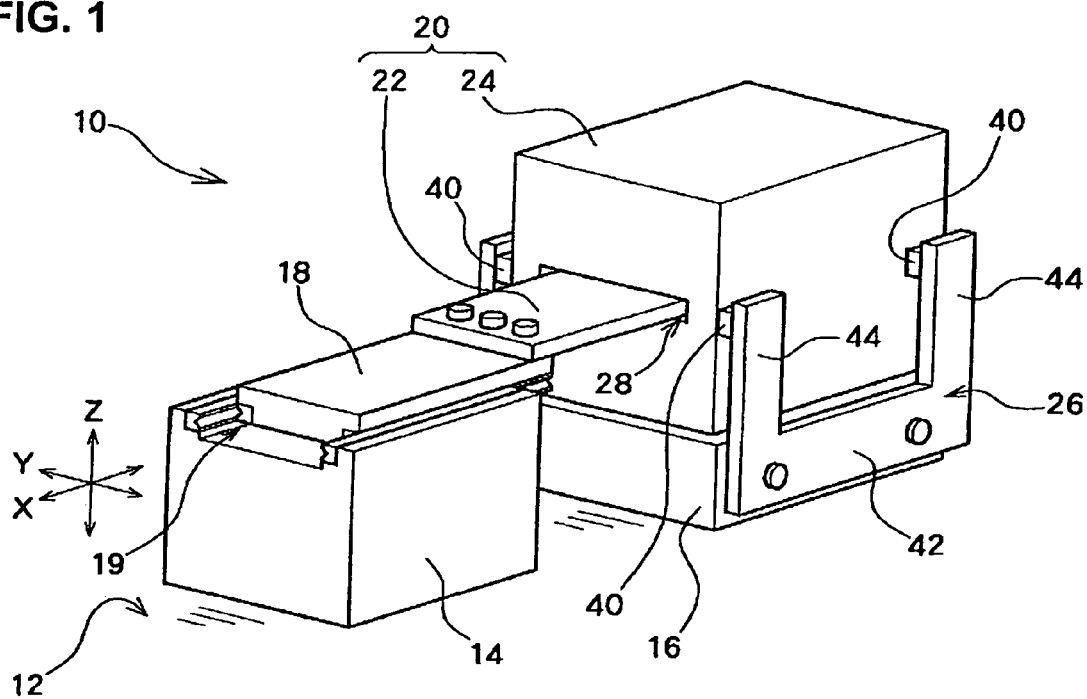
FIG. 1 is a perspective view of the construction of the wire bonding apparatus in one embodiment of the present invention, especially showing the construction in the vicinity of the motor driving device in which reaction movement has been eliminated.
Figure 2:
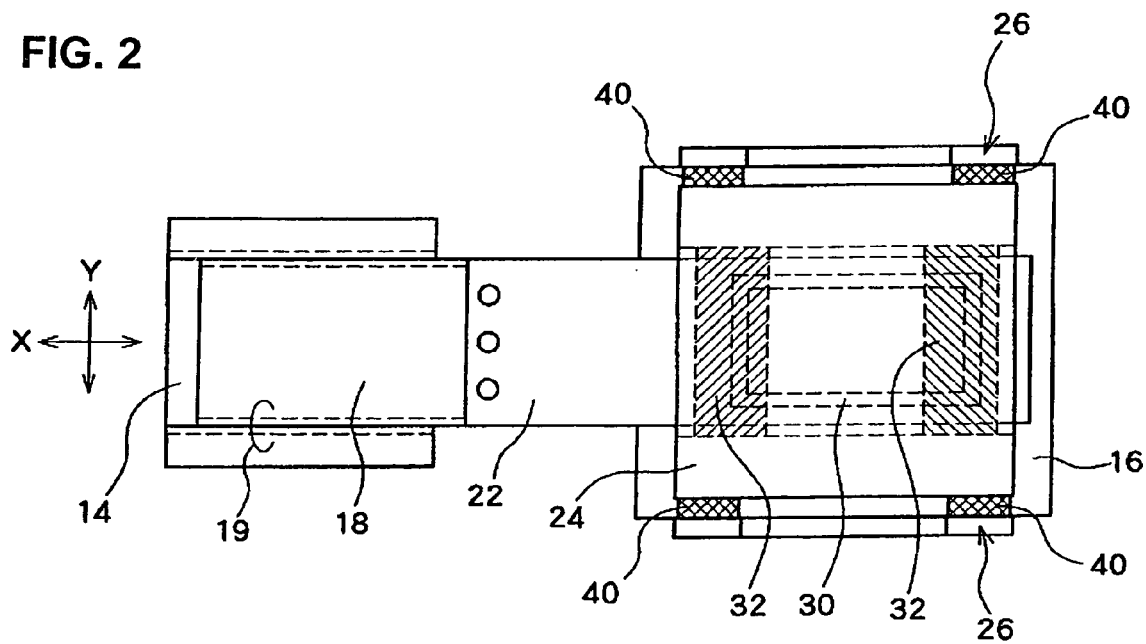
FIG. 2 is a top view thereof.
Figure 3:
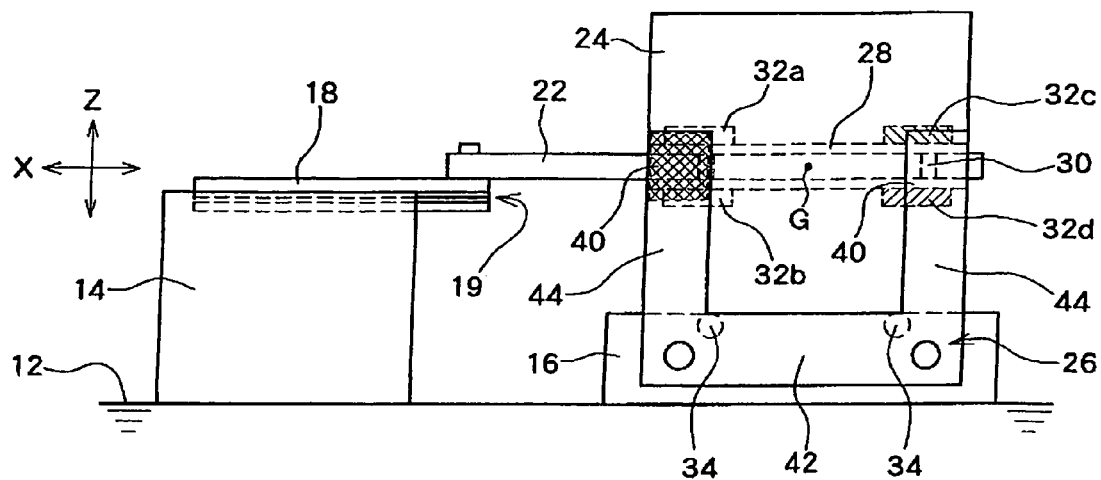
FIG. 3 is a side view thereof.

In FIGS. 1, 2 and 3, in a wire bonding apparatus 10, an XY table base 14 and a motor base 16 are fixedly provided on a mounting base 12.

On the XY table base 14, an X table and a Y table are mounted; however, FIG. 1 shows only the X table 18. The X table 18 is guided so as to be moved over the XY table base 14 in the X direction shown in FIG. 1.

On the motor base 16, a driving motor 20 is mounted. This driving motor 20 is constructed from a movable element 22 and a motor main body 24, and the movable element 22 is connected to the X table 18. The motor main body 24 is guided by a pair of motor guides 26 attached to the motor base 16 so that the motor main body 24 is movable in the X direction with laminated bodies 40 provided between the motor main body 24 and the motor guides 26.

The X table 18 is a flat plate; and it has a substantially rectangular shape. The X table 18 is a moving table on which a Y table (not shown in the drawing) is mounted, thus forming the XY table together with this Y table. The X table can be obtained by working, for instance, a metal plate.

The Y table, which is not shown in the drawing, is driven in the Y direction by a separate driving motor, which is likewise not shown in the drawings. Accordingly, the XY table is comprised of the X table, which is movable in the X direction, and the Y table, which is provided on the X table 18 and is movable in the Y direction; and a bonding head is provided on the upper Y table. By way of driving the XY table in the X and Y directions shown in FIG. 2, the bonding head is moved to arbitrary positions within the XY plane and positioned in such positions.

A table guide 19 is disposed between the upper part of the XY table base 14 and the X table 18, and this table guide 19 constitutes a pair of rectilinear roller guide mechanisms that have the function of guiding the X table 18 so that the table 18 is movable in the X direction on the XY table base 14. The table guide 19 is comprised of a set of V-groove guides disposed in the upper part of the XY table base 14, a set of V-groove guides disposed in the X table 18, and a plurality of rollers used for rolling that are disposed between these two V-grooves.

The set of V-groove guides in the upper part of the XY table base 14 are disposed parallel to the X direction at a spacing that corresponds to the width of the X table 18, and the openings of the grooves face each other. The other set of V-groove guides in the X table 8 are disposed so that the openings of the V-grooves face outward on each of the set of sides that form the width of the X table 18.

The above-described V-groove guides can be obtained by working a metal material that has a high rigidity such as tool steel or the like so that V-grooves with an accurate shape are formed; and then, if necessary, an appropriate anti-wear surface treatment can be performed thereon. The V-groove guides thus obtained are attached to the upper part of the XY table base 14 and to the X table 18 in accordance with the above-described arrangement by an appropriate fastening means such as screws or the like.

The driving motor 20 is comprised of a movable element 22 and a motor main body 24 as described above. The driving motor 20 drives the X table 18, which is connected to the movable element 22, in the X direction under the control of a control section (not shown in the figures) of the wire bonding apparatus 10.

As shown in FIGS. 2 and 3, the movable element 22 includes a movable coil 30; and one end of the movable element 22 is connected to the X table 18. The movable coil 30 is wound with an appropriate number of turns in the XY plane shown in FIG. 2, and it is preferable that the wound shape be a substantially rectangular in which component that is parallel to the X direction and a component that is parallel to the Y direction be combined. The movable coil 30 is connected to a motor driving circuit (not shown), and a driving current is supplied to the coil 30. The direction of the driving current is altered in accordance with the direction of movement of the X table 18.

The motor main body 24 is a fixed element, with reference to the movable element 22, in the case of a motor of the type in which reaction movement is eliminated; and the motor main body 24 includes magnets 32 that supply a magnetic field to the movable coil 30. The motor main body 24 overall has a substantially rectangular-solid shape, and a movable element moving passage 28 that constitutes a space through which the movable element 22 is moved is formed through this motor main body 24 in the X direction. Two magnets 32 each are, as seen from FIG. 3, respectively installed on the upper (ceiling) side and on the lower (floor) side of the movable element moving passage 28 and, as seen from FIG. 2, on the entry side and on the exit side of the movable element moving passage 28, so that the windings of the movable coil 30 are oriented in the Y direction.

More specifically, as seen from FIG. 3, four magnets 32 comprise magnets 32a, 32b, 32c and 32d. The magnets 32a and 32b are disposed on the entry side of the movable element moving passage 28, and the magnets 32c and 32d are disposed on the exit side of the movable element moving passage 28; in another view, the magnets 32a and 32c are disposed on the upper or ceiling side of the movable element moving passage 28, and the magnets 32b and 32d are disposed on the lower or floor side of the movable element moving passage 28. The magnets 32 are permanent magnets, and the polarity of the surfaces that face the inside of the movable element moving passage 28 is set to be the same in the magnets 32a and 32d, while the magnets 32b and 32c have the opposite polarity from this. In other words, the magnets 32 are disposed so that the orientation of the magnetic field formed by the set of magnets 32a and 32b on the entry side and the orientation of the magnetic field formed by the set of magnets 32c and 32d on the exit side are the opposite from each other. The respective magnets 32 are indicated by shading whose direction is varied according to the polarity, however, in FIG. 3, some of the shading is omitted in order to indicate the positional relationship with the laminated bodies 40.

With the arrangement described above, when electric current is caused to flow to the movable coil 30, a driving force in the X direction is generated by the interaction between the electric current flowing through the Y-direction portions of the windings and the crossing magnetic flux in the Z direction that is perpendicular to this electric current; and the orientation of this driving force becomes the same in the Y-direction winding portions on the entry side of the movable coil 30 and in the Y-direction winding portions on the exit side; as a result, the movable element 22 is driven in the X direction by these forces.

When the movable element 22 is driven in the X direction, the motor main body 24 receives the reaction force. To describe this in greater detail, in the same manner as when the movable coil 30 receives a driving force in the X direction as a result of cooperative action with the crossing magnetic flux, the magnets 32 receive a reaction force that has the same magnitude as the driving force, but an opposite orientation. As a result of this reaction force, the motor main body 24 is moved in the opposite direction from the movement direction of the movable element 22.

The mass of the motor main body 24 is set so that this mass is sufficiently large compared to the total mass obtained by combining the masses of the elements that are originally driven, i.e., the movable element 22 and X table 18 (and if necessary, the Y table, bonding head and the like (not shown in the figures)). For example, the mass of the motor main body 24 is set at a mass that is equal to or greater than five times the total mass of the driven parts such as the movable element 22 and the like. Accordingly, the acceleration and speed at which the motor main body 24 is moved in the opposite direction are much smaller than the acceleration and speed at which the movable element 22 and the like are moved, and compensation for the difference can be made by control; as a result, the movable element 22 can cause the X table 18 to move to the desired position even if the motor main body 24 is moved in the opposite direction.

Figure 4:
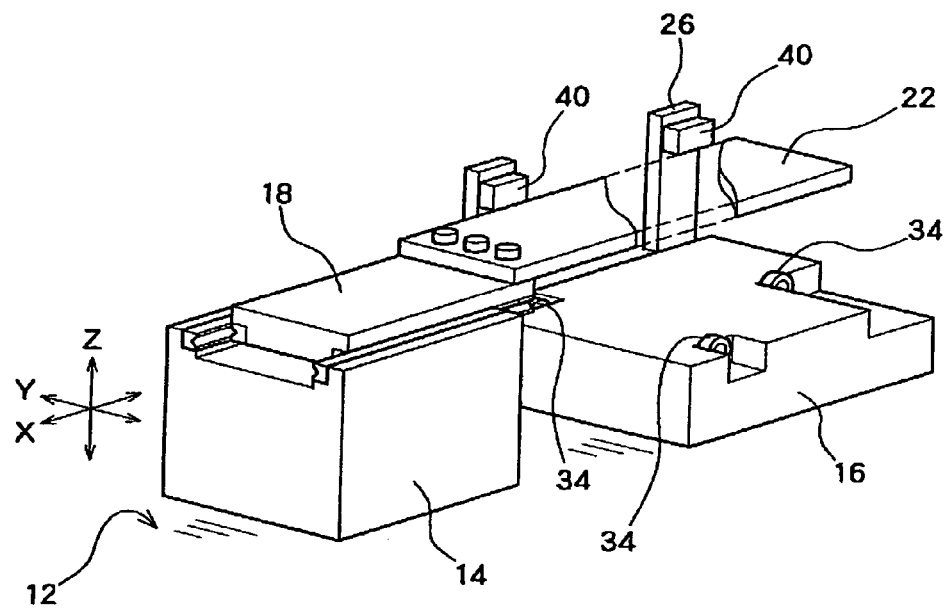
FIG. 4 is a perspective view of the wire bonding apparatus shown in FIG. 1 with the motor main body and one of the motor guides removed.

Rollers 34 are disposed on the motor base 16. These rollers 34 are rotatable about Y axis and have the functions of supporting the weight of the motor main body 24, and causing the motor main body 24 to make rolling movement in the X direction. As seen from FIG. 4 that shows the bonding apparatus of FIG. 1 with the motor main body 24 and motor guide 26 on the front side are omitted, three rollers 34 are provided on the motor base 16.

In regard to the arrangement of the rollers 34, it is necessary that a projected point of the center of gravity be within the triangle that is formed by the three rollers 34 when the position of the center of gravity of the motor main body 24 is projected onto the plane formed by the three rollers 34. It is necessary that this hold true even when the motor main body 24 is moved.

The pair of motor guides 26 attached to the motor base 16 and the laminated bodies attached to the tip ends of these motor guides 26 both guide the movement of the motor main body 24 in the X direction.

Each of the motor guides 26 is comprised of two attachment arms 44 that are connected to each other by lower connecting portions 42. Laminated bodies 40 are respectively attached to the tip (upper) ends of the attachment arms 44, and the motor guides 26 are fastened to the motor base 16 at the lower connecting portions 42. As shown in FIG. 3, the pair of motor guides 26 are installed so that the lower connecting portions 42 of the respective motor guides 26 are attached to the two side surfaces of the motor base 16 (whose shape is substantially that of a rectangular solid) that are parallel to the XZ plane. Furthermore, the laminated bodies 40 are positioned and attached to the tip ends of the motor guides 26 so that the center positions of the laminated bodies 40 in the Z-direction are within the horizontal plane that includes the center of gravity G of the motor main body 24. As a result, the application of unnecessary rotational torque to the motor main body 24 due to the recovery force or damping force arising from the viscoelasticity of the laminated bodies 40 can be suppressed.

The respective motor guides 26 are urged so that the laminated bodies 40 are pressed against the motor main body 24. This urging force is obtained by the elasticity of the cantilevers of the attachment arms 44 that extend from the lower connecting portions 42 of the motor guides 26; and instead, the urging force can be obtained by separately installed spring members (not shown).

The laminated bodies 40 are disposed between the motor main body 24 and the motor guides 26, and they allow movement of the motor main body 24 in the X direction and constrain movement of the motor main body 24 in the Y direction.

More specifically, in each one of the laminated bodies 40, viscoelastic rubber plates that have a spring element and a damping element are alternately disposed with rigid plates, and these rubber and rigid plates are laminated in a plurality of stages with the surfaces that face each other fastened together.

Figure 5:
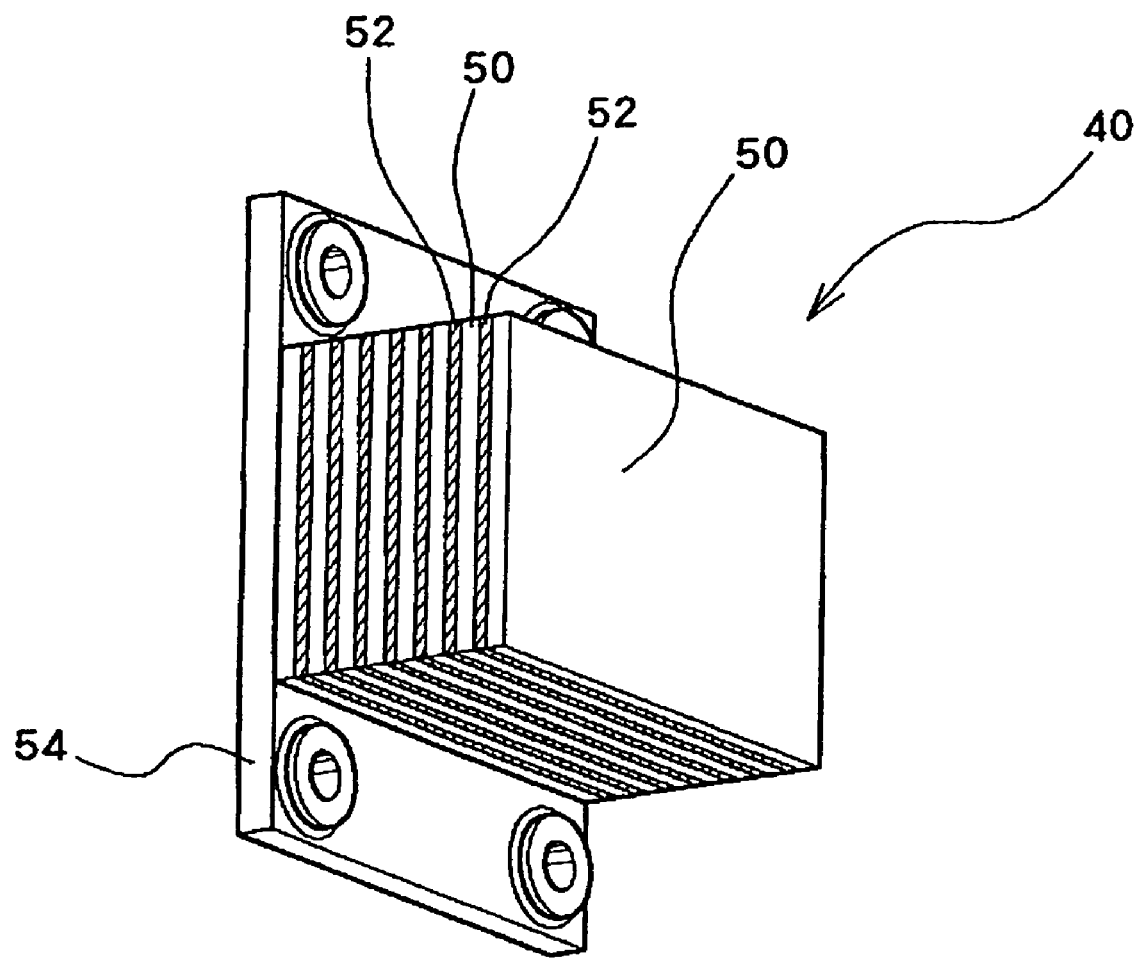
FIG. 5 shows the overall construction of one of the laminated bodies according to one embodiment of the present invention.

FIG. 5 shows the overall construction of one of the laminated bodies 40. In the laminated body 40, flat viscoelastic rubber plates 50 having a substantially rectangular shape are alternately laminated with flat rigid plates 52 having a more or less similar substantially rectangular shape, and these laminated plates are attached to an appropriate mounting plate 54. In the shown embodiment, eight viscoelastic rubber plates 50 and seven rigid plates 52 are used.

The flat viscoelastic rubber plates 50 are obtained by cutting thin plates of a silicone type gel material or styrene type gel material into a rectangular shape.

Focusing on the characteristics of a single flat viscoelastic rubber plate, when a force is applied parallel to the upper and lower surfaces of a flat viscoelastic rubber plate which is set horizontally, a considerable viscoelastic shear strain is generated in the direction of the upper and lower surfaces. On the other hand, when a force is applied perpendicular to the upper and lower surfaces of a viscoelastic rubber plate, a tensile-compressive strain is generated in the direction perpendicular to the upper and lower surfaces; however, if the thickness of the viscoelastic rubber plates is at an appropriate small value, then the amount of deformation can be small enough to be ignored. In other words, in these thin flat viscoelastic rubber plates (50), when a force is applied to the upper and lower surfaces, the rigidity is large in the direction perpendicular to the upper and lower surfaces, and the rigidity is small in the direction parallel to the upper and lower surfaces, so that the plates have a recovery force and damping force arising from viscoelasticity. θ Gel (trademark) model No. θ-5 manufactured by Geltec Co., Ltd. can be used as a silicon type gel material that has such characteristics. KG Gel (trademark) manufactured by Kitagawa Industries Co., Ltd. can be used as a styrene type gel material.

The rigid plates 52 are members that are inserted between the superimposed viscoelastic rubber plates 50 in order to obtain an appropriately large amount of deformation by the lamination of these plates in cases where the viscoelastic shear strain of a single viscoelastic rubber plate is small, and the rigid plates 52 have the function of constraining the deformation of the respective elastic rubber plates 50 to viscoelastic shear strain in the direction of the surfaces only. Metal plates such as copper, aluminum, and iron plates and plastic plates that have an appropriate rigidity, e.g., ABS resin or polycarbonate resin plates are used as the rigid plates of the present invention; and these metal or plastic plates are cut into appropriate shape and size which are substantially the same as those of the viscoelastic rubber plates 50.

The viscoelastic rubber plates 50 and rigid plates 52 are firmly fastened to each other at the mutually facing surfaces. For example, an appropriate adhesive material such as a two-sided adhesive tape or the like is used for this fastening. Furthermore, it is also possible to knead an adhesive material into the flat surface of the viscoelastic rubber plates 50 beforehand, or to fasten such an adhesive material to the viscoelastic rubber plates.

As to the dimensions of the laminated bodies 40, it is preferable that the viscoelastic rubber plates 50 (using the above-described materials) have dimensions of approximately 35 mm×approximately 20 mm, and a thickness of approximately 1 mm. As to the rigid plates 52, it is preferable that they have dimensions that are the same as or somewhat larger than the dimensions of the viscoelastic rubber plates 50. The thickness of the rigid plates 52 can vary according to the material used; however, a thickness that results in a sufficient rigidity is required.

Such dimensions as described above vary considerably according to performance values such as the operating speed of the wire bonding apparatus 10 and the like, and according to the construction including the mass of the XY table and driving motor 20 and the like. Accordingly, the above dimensions are merely examples; and appropriate shapes, dimensions, numbers of laminated bodies 40, disposition and the like are selected during the design of individual wire bonding apparatuses 10.

As a result of the above structure, in each of the laminated bodies 40, when a force is applied to the both surfaces of the laminated body, the rigidity is large in the direction perpendicular to the upper and lower surfaces, and the rigidity is small in the direction parallel to the upper and lower surfaces, so that the laminated body has, as a whole, a recovery force and damping force arising from viscoelasticity.

The mounting plates 54 facilitate the attachment of the laminated bodies 40 to the motor main body 24 and motor guides 26. In the embodiment of FIG. 5, attachment holes are formed at the corners of the mounting plate 54. The mounting plates 54 can be respectively attached to both sides of the laminated bodies 40. Alternatively, the mounting plates 54 may be omitted, so that the laminated bodies 40 are attached directly to the motor main body 24 and motor guides 26.

The laminated bodies 40 are mounted on the motor main body 24 and motor guides 26 so that the laminated surfaces are disposed parallel to the direction of movement of the motor main body 24. A total of four laminated bodies 40 are mounted, with one surface side of each one of the laminated bodies 40 is attached to the motor main body 24, and the other surface side is attached to one of the motor guides 26.

In the structure of FIG. 1, both the motor main body 24 and motor base 16 have a substantially rectangular-solid shape and have surfaces that are respectively parallel to the XZ plane, and the motor guides 26 are attached to the surfaces that are parallel to the XZ plane of the motor base 16. Accordingly, the laminated body attachment areas on the tip ends of the attachment arms 44 of the motor guides 26 are also parallel to the XZ plane. Consequently, one side surface of each laminated body 40 is attached by being fastened to a surface parallel to the XZ plane of the motor main body 24, and the other side surface of each laminated body 40 is attached by being fastened to a surface parallel to the XZ plane at the tip end of the attachment arm 44 of one of the motor guides 26.

In cases where the motor main body 24 is not substantially a rectangular solid, or in cases where there is no surface parallel to the direction of moving of the motor main body 24, then wall surfaces that are parallel to the direction of moving of the motor main body 24 can be formed in the external wall surfaces of the motor main body 24, so that such wall surfaces are used as the motor side attachment surface, and one side of the laminated body 40 is attached to this motor side attachment surface. Likewise, in cases where the attachment arms 44 of the motor guide 26 have no surfaces that are parallel to the direction of moving of the motor main body 24, then wall surfaces that are parallel to the direction of moving of the motor main body 24 can be formed on the tip ends of the attachment arms 44, so that such wall surfaces are used as the guide side attachment surface, and another side of the laminated body 40 is attached to this guide side attachment surface. In this case, the surface that is parallel to the direction of moving of the motor main body 24 need not be a surface that is parallel to the XZ plane illustrated in FIG. 1.

The operation of the wire bonding apparatus 10 structured as described above will be described with reference to FIGS. 6(a) through 6(d).

Figure 6A:
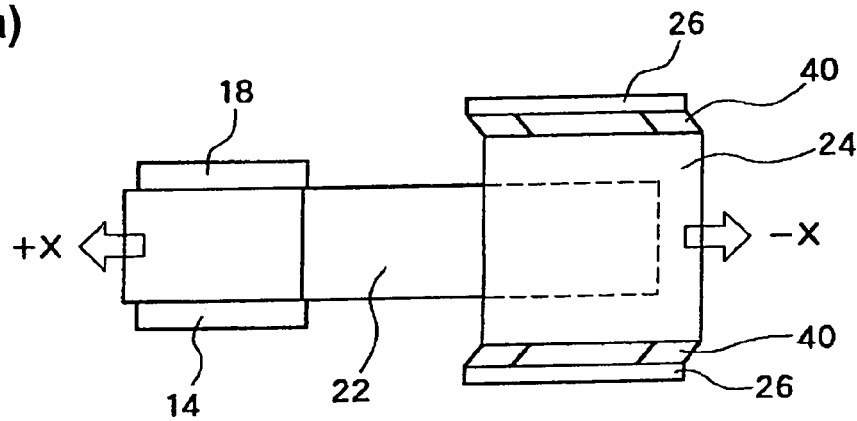
FIGS. 6(*a*) through 6(*d*) illustrate the operation of the wire bonding apparatus according to one embodiment of the present invention.
Figure 6B:
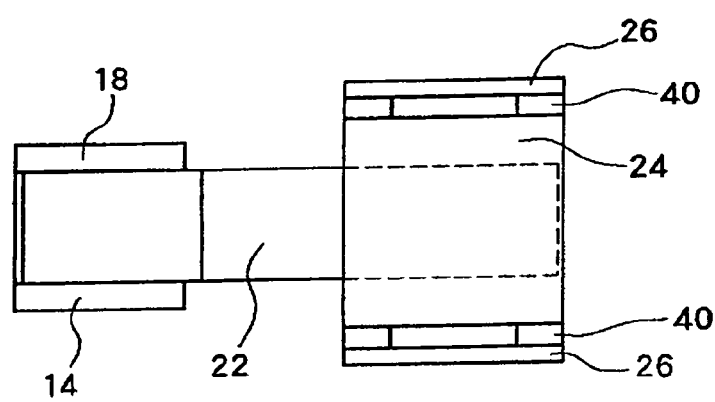

FIGS. 6(a) and 6(b) show the movements of the movable element 22, motor main body 24 and laminated bodies 40 when the movable element 22 receives a driving force from the motor main body 24. FIG. 6(d) is a diagram showing the return of the motor main body 24 and laminated bodies 40 to their original positions following the movement shown in FIG. 6(c). All of these diagrams in FIGS. 6(a) through 6(d) are top views; and elements that are common to FIGS. 1 through 3 are labeled with the same symbols, and a detailed description of such elements is omitted.

FIG. 6(b) shows the so-called neutral state, and no driving force is generated between the motor main body 24 and movable element 22. The laminated bodies 40 are also in a neutral state. From this state, driving signals are supplied to the motor main body 24 from the control section (not shown in the figures) of the wire bonding apparatus 10, so that the movable element 22 is driven.

FIG. 6(a) shows a case where the movable element 22 receives driving force in the +X direction from the motor main body 24. In this case, the movable element 22 is moved in the +X direction; at the same time, however, the motor main body 24 receives a reaction force in the −X direction and is moved in the −X direction over the rollers 34 (not shown in FIG. 6(a)).

In this case, as seen from FIG. 6(a), one surface of each laminated body 40 attached between the motor guides 26 and motor main body 24 is moved in the −X direction together with the motor main body 24, while the other surface which is fastened to the motor guides 26 in a fixed relationship with the mounting base is not moved.

Thus, in each one of the laminated bodies 40, a state is produced in which an external force is applied between one surface on the outermost side and the other surface. As a result, each laminated body 40 shows a small rigidity in the −X direction and guides the motor main body 24, so that movement thereof is possible in the −X direction; and each laminated body 40 also shows a large rigidity in the other directions perpendicular to this (−X) direction, e.g., in the vertical direction and left-right direction with respect to the direction of moving of the motor main body, so that the movement of the motor main body 24 in these directions is constrained.

Consequently, the motor main body 24 is guided by the motor guides 26 (which are in a fixed relationship with the mounting base) via the viscoelastic force of the laminated bodies 40 and moved in the −X direction. Thus, the reaction force received by motor main body 24 is relieved by the movement of the motor main body 24 in the −X direction, and the motor guides 26 receive only the effects of the viscoelasticity; as a result, there is almost no effect of any reaction force on the mounting base.

Figure 6C:
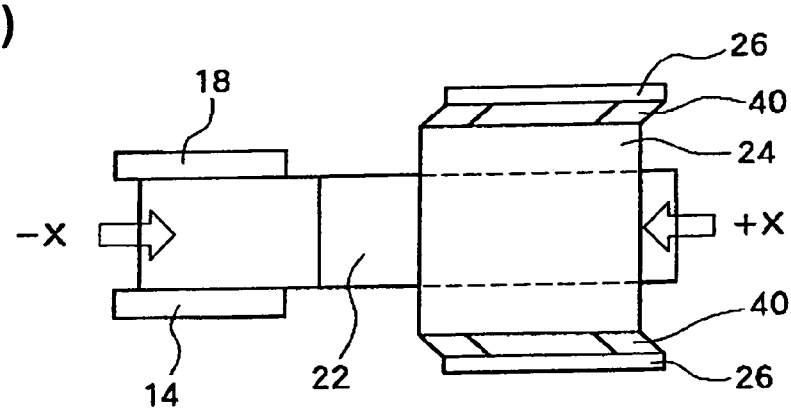
Figure 6D:
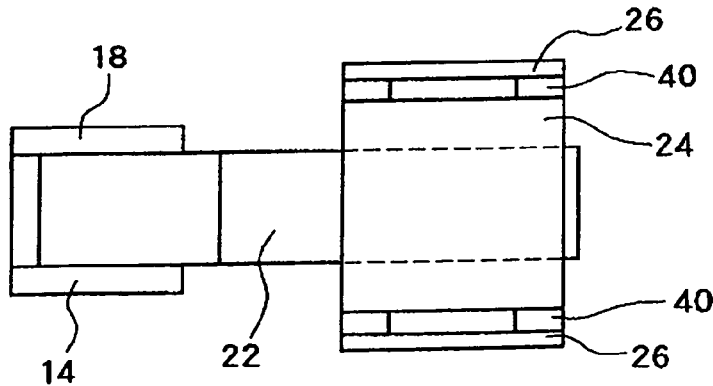

FIG. 6(c) shows a case in which the movable element 22 receives driving force in the −X direction from the motor main body 24. This is the opposite of the situation shown in FIG. 6(a); and the movable element 22 is moved in the −X direction, and at the same time, the motor main body 24 receives a reaction force in the +X direction and is moved over the rollers 34 (not shown in FIG. 6(c)) in the +X direction.

Thus, each laminated body 40 shows a small rigidity in the +X direction and guides the motor main body 24, so that movement thereof is possible in the +X direction; and each laminated body 40 also shows a large rigidity in the directions perpendicular to this (+X) direction, e.g., the vertical direction and left-right direction with respect to the direction of moving of the motor main body, so that the movement of the motor main body 24 in these directions is constrained.

Consequently, the motor main body 24 is guided by the motor guides 26 (which are in a fixed relationship with the mounting base) via the viscoelastic force of the laminated bodies 40 and moved in the +X direction, so that there is almost no effect of any reaction force on the mounting base.

As seen from the above with reference to FIGS. 6(*a*) and 6(*c*), the laminated bodies 40 are caused to undergo a displacement by the viscoelasticity between the attachment positions of the motor guides 26, which are in fixed positions on the mounting base, and the attachment positions of the motor main body 24, which is moved in the X direction. Accordingly, the movement of the motor main body 24 in the X direction depends on the viscoelasticity of the laminated bodies 40 and is accompanied by a recovery force and a damping effect.

FIG. 6(*d*) shows the state in which sufficient time has elapsed from the state shown in FIG. 6(*c*), i.e., from the time at which the movable element 22 received a driving force from the motor main body 24, the movable element 22 was moved in the −X direction, and the motor main body 24 began to be moved in the +X direction. The movable element 22 has moved to a specified position under the control of the control section (not shown in FIG. 6(*d*)). As seen from FIG. 6(*c*), the motor main body 24 is temporarily moved in the +X direction so that the reaction force is relieved; then, as a result of the spring elements of the laminated bodies 40, the motor main body 24 again begins to return to its original position. Furthermore, after a sufficient time has elapsed, the motor main body 24 returns, as shown in FIG. 6(*d*), to the original neutral state, and the laminated bodies 40 also take a neutral state.

In the above description, rollers 34 are installed between the bottom of the motor main body 24 and the motor base 16. However, it is also possible to install laminated bodies 40 between the bottom surface of the motor main body 24 and the motor base 16 without using the rollers 34.

As seen from the above, the motor main body can be moved by viscoelastic force in the opposite direction from the driving of the movable element 22 by means of a simple construction in which laminated bodies that have a spring element and a damping element are installed between the mounting base and the motor main body, so that the reaction force that arises from the driving of the movable element is prevented from affecting the mounting base, and the motor main body can be returned to its original position by this viscoelastic force.

The invention claimed is:

1. A bonding apparatus comprising a mounting base and a bonding motor provided on said mounting base and has a movable element and a motor main body, wherein said motor main body is movable in an opposite direction from said movable element when said movable element is driven, so that a reaction force applied to said mounting base as a result of driving of said movable element is canceled, said bonding apparatus further comprising:

motor guides which guide movement of said motor main body, and a plurality of laminated bodies which are disposed between said motor main body and said motor guides, wherein each of said plurality of laminated bodies comprises flat rigid plates and viscoelastic flat rubber plates having spring elements and damping elements, so that said flat rigid plates and viscoelastic flat rubber plates are alternately disposed and stacked in a plurality of stages with mutually facing surfaces of said plates fastened to each other;

with reference to an external force applied between one surface and another surface of said laminated body, rigidity in a direction perpendicular to laminated surfaces of said flat rigid plates and viscoelastic flat rubber plates is set to be greater than rigidity in a direction parallel to the laminated surfaces of said flat rigid plates and viscoelastic flat rubber plates, thus having a recovery force and a damping force based on viscoelasticity thereof; and said laminated surfaces are disposed parallel to a direction of movement of said motor main body, and one surface of each one of said laminated bodies is attached to said motor main body while another surface thereof is attached to each one of said motor guides.

2. The bonding apparatus according to claim 1, wherein said motor main body has, on both side surfaces thereof, motor side attachment portions which include wall surfaces that are parallel to the direction of movement of said motor main body, said motor guides have guide side attachment portions which face side surfaces of said motor main body and which include wall surfaces that are parallel to the direction of movement of said motor main body and that face said motor side attachment portions, and one surface of each one of said laminated bodies is attached to one of said motor side attachment portions while another surface thereof is attached to one of said guide side attachment portions.

3. The bonding apparatus according to claim 1 or 2, further comprising a driving means that presses said laminated bodies against said motor main body and further increase the rigidity in the direction perpendicular to said laminated surfaces.

4. The bonding apparatus according to claim 1 or 2, wherein said viscoelastic rubber plates are constructed from a gel material selected from the group consisting of silicone type rubber and styrene type rubber.

5. The bonding apparatus according to claim 2, wherein said plurality of laminated bodies are disposed in positions in a horizontal plane including a center of gravity of said motor main body on both side surfaces of said motor main body and in positions that are symmetrical with respect to an axis that coincides with the direction of movement of said motor main body including a center of gravity thereof.

6. The bonding apparatus according to claim 1 or 2, further comprising a plurality of rollers that are provided on said mounting base and support said motor main body to allow said motor main body to make movement.

* * * * *